(12) United States Patent
Obayashi et al.

(10) Patent No.: US 12,000,905 B2
(45) Date of Patent: Jun. 4, 2024

(54) POWER SUPPLY SYSTEM FOR MOVING BODY

(71) Applicant: DENSO CORPORATION, Kariya (JP)

(72) Inventors: Kazuyoshi Obayashi, Kariya (JP); Masaya Takahashi, Kariya (JP); Naoki Katayama, Kariya (JP)

(73) Assignee: DENSO CORPORATION, Kariya (JP)

( * ) Notice: Subject to any disclaimer, the term of this patent is extended or adjusted under 35 U.S.C. 154(b) by 442 days.

(21) Appl. No.: 17/483,174

(22) Filed: Sep. 23, 2021

(65) Prior Publication Data
US 2022/0011379 A1    Jan. 13, 2022

Related U.S. Application Data

(63) Continuation of application No. PCT/JP2020/006481, filed on Feb. 19, 2020.

(30) Foreign Application Priority Data

Mar. 27, 2019  (JP) .................................. 2019-061697

(51) Int. Cl.
| | | |
|---|---|---|
| *G01R 31/54* | (2020.01) | |
| *G01R 31/00* | (2006.01) | |
| *G01R 31/52* | (2020.01) | |
| *H02J 7/14* | (2006.01) | |

(52) U.S. Cl.
CPC ............ *G01R 31/54* (2020.01); *G01R 31/006* (2013.01); *G01R 31/52* (2020.01); *H02J 7/1438* (2013.01)

(58) Field of Classification Search
CPC ...... G01R 31/54; G01R 31/006; G01R 31/52; H02J 7/1438; H02J 7/1423; H02J 7/34; B60R 16/03; H02H 7/20
See application file for complete search history.

(56) References Cited

U.S. PATENT DOCUMENTS

| | | | |
|---|---|---|---|
| 2012/0127621 A1* | 5/2012 | Knapp, Jr. | ............. H02H 3/093 361/94 |
| 2017/0225635 A1* | 8/2017 | Obayashi | ................ F02B 39/10 |
| 2018/0001850 A1* | 1/2018 | Kontani | .................... H02J 1/08 |
| 2019/0013664 A1 | 1/2019 | Yasunori | |
| 2019/0144028 A1 | 5/2019 | Taki et al. | |
| 2019/0144029 A1 | 5/2019 | Taki et al. | |
| 2019/0144030 A1 | 5/2019 | Sakai et al. | |
| 2020/0094758 A1* | 3/2020 | Kawakami | ............ B60R 16/033 |

* cited by examiner

*Primary Examiner* — Jermele M Hollington
*Assistant Examiner* — Zannatul Ferdous
(74) *Attorney, Agent, or Firm* — Oliff PLC

(57) ABSTRACT

A power supply system for moving body includes a first power source, a first current path, a second power source, a second current path. The first power source supplies electric power to a redundant load. The first current path connects the first power source and the redundant load. The second power source supplies electric power to the redundant load. The second current path connects the second power source and the redundant load.

8 Claims, 9 Drawing Sheets

POWER SUPPLY SYSTEM FOR MOVING BODY

CROSS REFERENCE TO RELATED APPLICATIONS

The present application is a continuation application of International Patent Application No. PCT/JP2020/006481 filed on Feb. 19, 2020, which designated the U.S. and claims the benefit of priority from Japanese Patent Application No. 2019-061697 filed on Mar. 27, 2019. The entire disclosures of all of the above applications are incorporated herein by reference.

TECHNICAL FIELD

The present disclosure relates to a power supply system for moving body.

BACKGROUND

A switch device for an in-vehicle power supply capable of supplying electric power from two power storage devices to one power supply circuit has been proposed. An input of the power supply circuit and each power storage device are connected with a diode provided in respective current path.

SUMMARY

The present disclosure provides a power supply system for moving body. The power supply system includes a first power source, a first current path, a second power source, a second current path. The first power source supplies electric power to a redundant load. The first current path connects the first power source and the redundant load. The second power source supplies electric power to the redundant load. The second current path connects the second power source and the redundant load.

BRIEF DESCRIPTION OF DRAWINGS

The features and advantages of the present disclosure will become more apparent from the following detailed description made with reference to the accompanying drawings. In the drawings.

DETAILED DESCRIPTION

Figure 1:
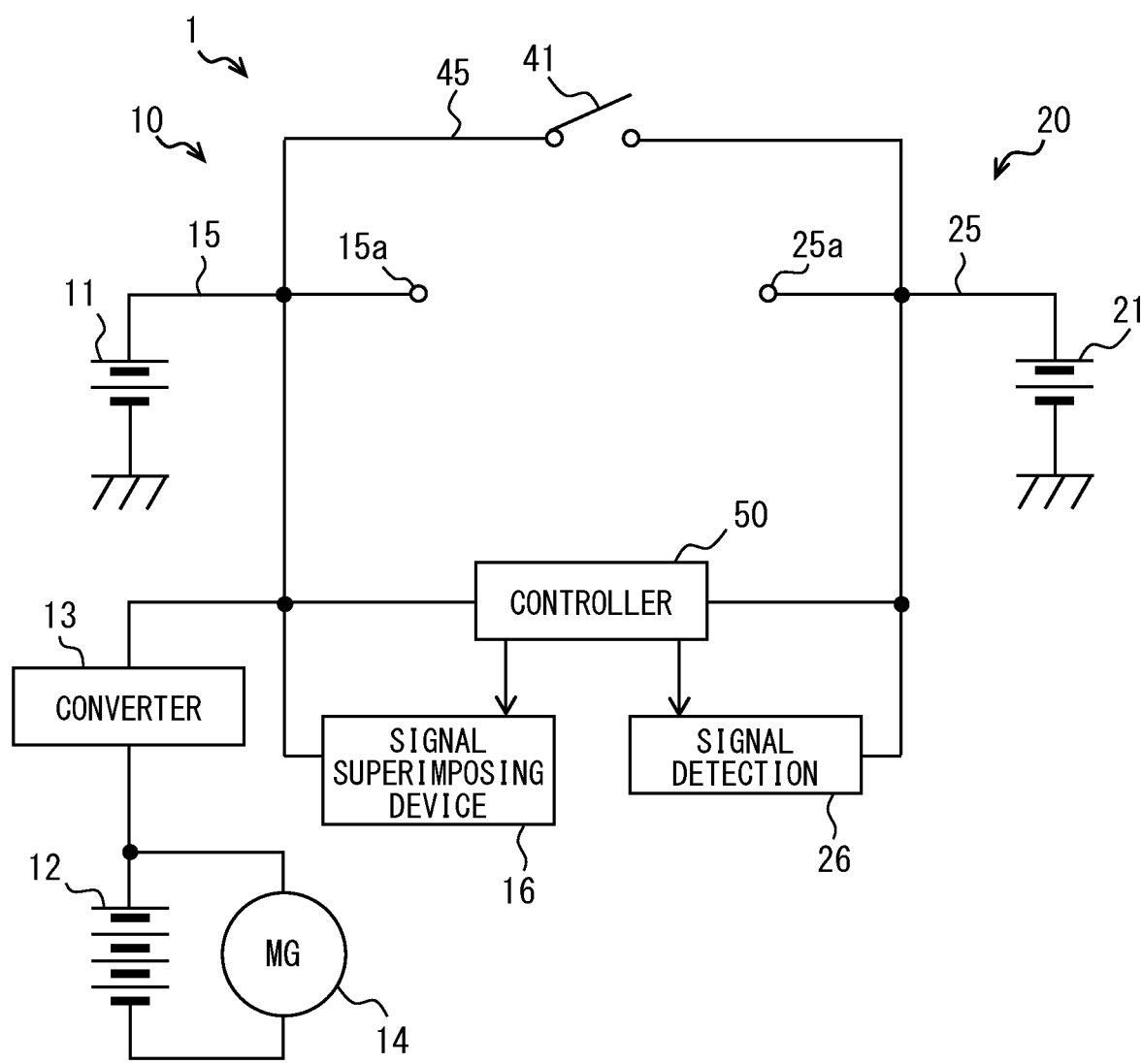
FIG. 1 is a diagram showing a schematic configuration of a power supply system for a moving body.

As an example of a power supply system for moving body, when electric power is supplied to a load, the load is operated by separately being supplied with electric power from different current paths. This configuration enhances redundancy of the load. However, there may be a case where different current paths that should be originally separable are connected inseparably, for example, due to a load being erroneously connected. In this case, if a power supply circuit portion or the like in which an OR circuit of diode receives electric power from each current path is grounded in the load, entire connected current path is affected by the ground fault. Therefore, there may be a difficulty that electric power cannot be appropriately supplied to all the loads connected to the current path. US 2019/0013664 A1 discloses a switch device for an in-vehicle power supply capable of supplying electric power from two power storage devices to one power supply circuit. The disclosure of US 2019/0013664 A1 is incorporated herein by reference as an explanation of technical elements in the present disclosure.

The present disclosure provides a power supply system for moving body capable of determining whether a load connection is appropriate.

An exemplary embodiment of the present disclosure provides a power supply system for moving body. The power supply system includes a first power source, a first current path, a signal generation unit, a second power source, a second current path, a signal detection unit, and a control unit. The first power source is configured to supply electric power to a redundant load. The first current path is configured to connect the first power source and the redundant load. The signal generation unit is connected to the first current path and configured to generate a test signal. The second power source is configured to supply electric power to the redundant load. The second current path is configured to connect the second power source and the redundant load. The signal detection unit is connected to the second current path and configured to detect presence or absence of the test signal. The control unit is configured to execute a continuity test in a state where the redundant load is connected to the first current path and the second current path. In the continuity test, the control unit determines whether the first current path and the second current path are connected with each other based on a detection result of the test signal in the signal detection unit.

In the exemplary embodiment of the present disclosure, the control unit executes a continuity test in a state where the redundant load is connected to the first current path and the second current path, and determines whether the first current path and the second current path are conducted. Therefore, the configuration can determine whether the first current path and the second current path are in a separable state while the redundant load is connected. Therefore, the power supply system itself can check for deficiencies in the load itself and deficiencies in the connection method when connecting the loads. The configuration can provide a power supply system capable of determining whether the connection of the load is appropriate.

Embodiments will be described with reference to the drawings. In some embodiments, parts that are functionally and/or structurally corresponding to each other and/or associated with each other are given the same reference numer-

First Embodiment

A power supply system 1 is a system for supplying electric power to a moving body having multiple electric loads driven by electric power. The power supply system 1 may be mounted on an automobile traveling by using a prime mover such as an engine or a traveling motor. In the following, a case where the power supply system 1 is mounted on an automobile will be described as an example. However, the moving body is not limited to a vehicle such as an automobile and a motorcycle, and may be a ship, an aircraft, a transportation equipment, and the like.

In FIG. 1, the power supply system 1 includes a first auxiliary battery 11, a high voltage battery 12, a motor generator 14, and a second auxiliary battery 21. Hereinafter, the motor generator 14 may be referred to as MG 14. The first auxiliary battery 11 and the second auxiliary battery 21 are devices for storing electric power for an electric load. The first auxiliary battery 11 and the second auxiliary battery 21 are DC voltage sources that are capable of being charged and discharged. The rated voltage of each of the first auxiliary battery 11 and the second auxiliary battery 21 is, for example, 12V. As the first auxiliary battery 11 and the second auxiliary battery 21, a secondary battery such as a lead storage battery, a nickel hydrogen battery, a lithium ion battery, or a capacitor can be adopted. As the first auxiliary battery 11 and the second auxiliary battery 21, a lithium ion battery having a high energy density and easy to miniaturize is particularly preferable. The first auxiliary battery 11 is an example of a first power source. The second auxiliary battery 21 is an example of a second power source.

The high voltage battery 12 is a device capable of storing electric power for the electric load. The high voltage battery 12 is a DC voltage source capable of being charged and discharged. The rated voltage of the high voltage battery 12 is, for example, 300V. As the high voltage battery 12, a secondary battery such as a lead storage battery, a nickel hydrogen battery, or a lithium ion battery can be adopted. The high voltage battery 12 is preferably a lead-acid battery or a lithium-ion battery, which can easily secure a large storage capacity. The high voltage battery 12 is an example of a high voltage power source. Further, the MG 14 uses electric power of the high voltage battery 12 to generate power for driving the moving body. The MG 14 functions as a motor and generator for EV/PHEV/HEV. When the rated voltage of the high voltage battery 12 is, for example, 48V, the MG 14 functions as a motor and generator for the 48V system. The 48V voltage output from the high voltage battery 12 is applied to, for example, a load of the electric supercharger. When the high voltage battery 12 is used in the 48V system, the circuit configuration is such that the negative side of the high voltage battery 12 is grounded.

The power supply system 1 includes a first current path 15 and a second current path 25. The first auxiliary battery 11 and a signal superimposition device 16 are connected to the first current path 15. The high voltage battery 12 and the MG 14 are connected to the first current path 15 via the converter 13. The converter 13 is a DCDC converter that converts a DC voltage into a DC voltage having a different voltage value. The converter 13 steps down a high voltage of the high voltage battery 12 to a voltage of the first auxiliary battery 11. The first current path 15 is provided with a first connection terminal 15a for connecting an electric load. The second auxiliary battery 21 and a signal detection unit 26 are connected to the second current path 25. The second current path 25 is provided with a second connection terminal 25a for connecting an electric load. The signal superimposition device 16 is also referred to as a signal generation unit or a signal generation circuit. The signal detection unit 26 is also referred to as a signal detection circuit.

Each device such as the first auxiliary battery 11 connected to the first current path 15 and the first current path 15 constitutes a first system 10. Each device such as the second auxiliary battery 21 connected to the second current path 25 and the second current path 25 constitutes a second system 20. The power supply system 1 includes two power systems, the first system 10 and the second system 20.

The power supply system 1 includes a control unit 50. The control unit 50 includes a travel control unit that controls a travel of the vehicle, a display control unit that controls a warning display on the display, and the like. The control unit 50 is connected to both the first current path 15 and the second current path 25. The control unit 50 is driven by receiving electric power from the first current path 15 and the second current path 25. In other words, the control unit 50 is an electrical load that receives electric power from multiple power sources, such as the first auxiliary battery 11 connected to the first current path 15 and the second auxiliary battery 21 connected to the second current path 25. In other words, the control unit 50 is a load in which supply path for electric power is redundantly provided.

The power supply system 1 includes a connection path 45 that connects the first current path 15 and the second current path 25. A connection switch 41 is provided in the connection path 45. The connection switch 41 switches between a conducted state and a separated state. In the conducted state, the first current path 15 and the second current path 25 are connected via the connection path 45. In the separated state, the first current path 15 and the second current path 25 are not connected via the connection path 45. Here, conducted indicates a state of being electrically connected. When the connection switch 41 turns on, the first current path 15 and the second current path 25 are in the conducted state. When the connection switch 41 turns off, the first current path 15 and the second current path 25 are in the separated state.

The first system 10 and the second system 20 are separable from each other by switching the connection switch 41 on and off. Therefore, even when a failure such as a ground fault occurs in the first system 10, the failure of the first system 10 does not affect the second system 20 by turning off the connection switch 41. Alternatively, when electric power stored in the second auxiliary battery 21 is low, the second auxiliary battery 21 can be charged using electric power generated by the MG 14 or the like by turning on the connection switch 41.

Figure 2:
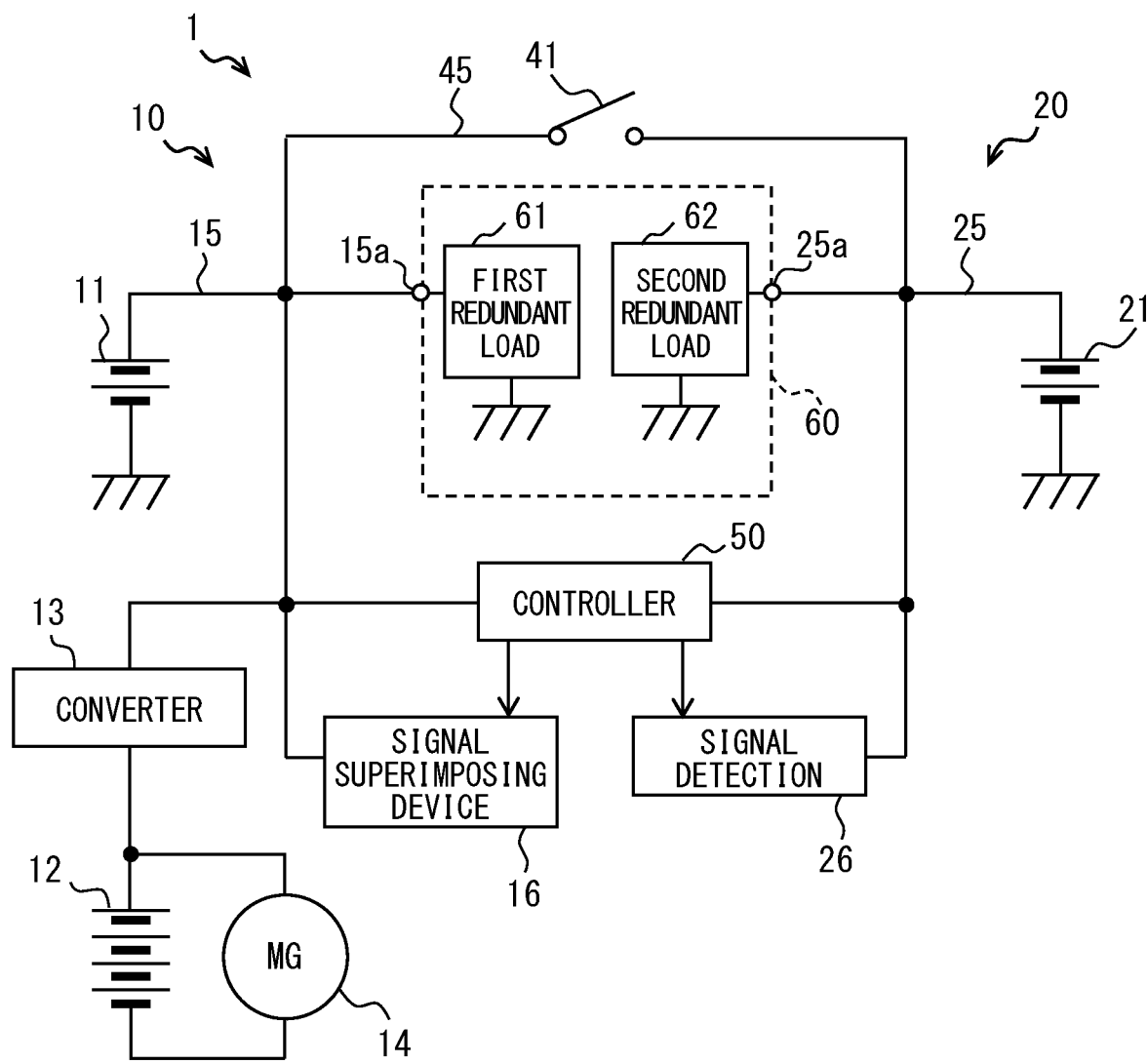
FIG. 2 is a diagram showing a schematic configuration of the power supply system in a state where a redundant load is connected.

In FIG. 2, a redundant load 60 is connected to the first connection terminal 15a and the second connection terminal 25a. The redundant load 60 includes a first redundant load 61 and a second redundant load 62. The first redundant load 61 and the second redundant load 62 can exhibit functions that the redundant load 60 should perform with only one of the first redundant load 61 and the second redundant load 62. In other words, the redundant load 60 is redundantly configured by multiple loads that performs functions of the redundant load 60. The redundant load 60 is a load capable of receiving electric power supply from both the power systems of the first system 10 and the second system 20. In other words, the redundant load 60 is a load in which electric power supply paths are redundantly provided by the multiple power systems.

The redundant load 60 is, for example, an electric power steering device. In this case, each of the first redundant load 61 and the second redundant load 62 is a load including a motor that assists the steering force. The electric power steering device is a device that needs to continue to operate even when a part of the power supply is lost. Even when a load of one of the first redundant load 61 and the second redundant load 62 fails or an equipment or wiring of one of the first redundant load 61 and the second redundant load 62 fails, the redundant load 60 is capable of functioning as an electric power steering device by using the remaining one load. Here, when only one of the first redundant load 61 and the second redundant load 62 functions appropriately, the steering performance is reduced compared with a case where both the first redundant load 61 and the second redundant load 62 function appropriately. Therefore, normally, the steering performance is maintained in a good state by using both the first redundant load 61 and the second redundant load 62.

The redundant load 60 is, for example, a peripheral monitoring device. In this case, the first redundant load 61 and the second redundant load 62 are loads such as an imaging device such as a camera, LIDAR, and a millimeter wave radar. The peripheral monitoring device is a device that needs to continue to operate even when a part of the power supply is lost. Even when a load of one of the first redundant load 61 and the second redundant load 62 fails or an equipment or wiring of one of the first redundant load 61 and the second redundant load 62 fails, the redundant load 60 is capable of functioning as a peripheral monitoring device by using the remaining one load. Further, the peripheral monitoring device may be configured by using multiple loads of the similar type, such as by using the first redundant load 61 as a first camera and the second redundant load 62 as a second camera. Alternatively, the peripheral monitoring device may be configured by combining different types of loads, such as by using the first redundant load 61 as a camera and the second redundant load 62 as a LIDAR.

Figure 3:
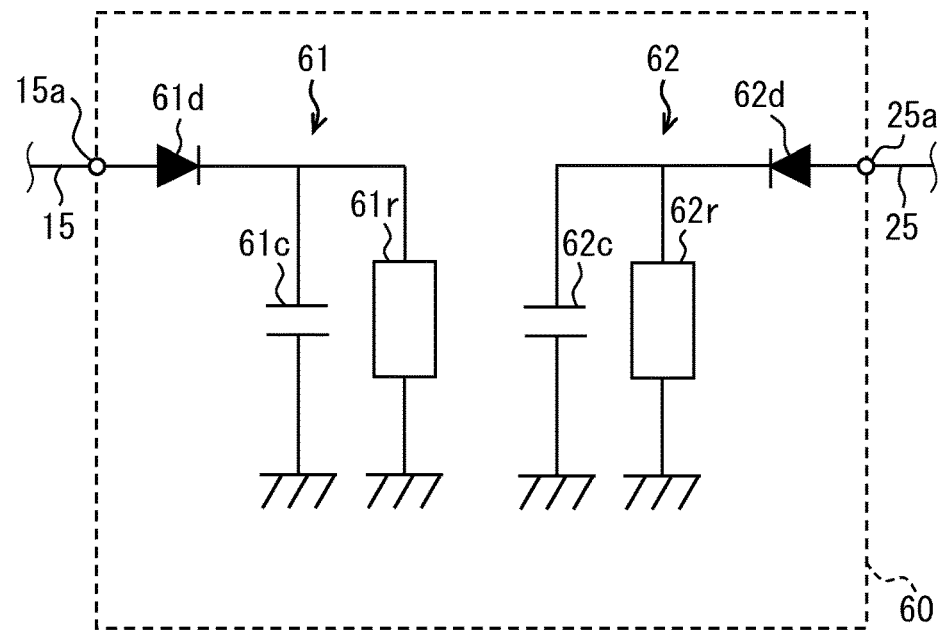
FIG. 3 is a diagram showing an appropriate redundant load.

FIG. 3 shows an example of a case where the connection of the first current path 15 and the second current path 25 via the redundant load 60 is appropriate. The first redundant load 61 that forms a part of the redundant load 60 includes a first resistor 61r, a first capacitor 61c, and a first diode 61d. The first diode 61d allows a current to flow from the first connection terminal 15a toward the first resistor 61r and the first capacitor 61c. On the other hand, the first diode 61d restricts a current to flow from the first resistor 61r and the first capacitor 61c toward the first connection terminal 15a.

The second redundant load 62 that forms a part of the redundant load 60 includes a second resistor 62r, a second capacitor 62c, and a second diode 62d. The second diode 62d allows a current to flow from the second connection terminal 25a toward the second resistor 62r and the second capacitor 62c. On the other hand, the second diode 62d restricts a current to flow from the second resistor 62r and the second capacitor 62c toward the second connection terminal 25a.

As the first diode 61d and the second diode 62d, it is preferable to use a reverse connection prevention diode having a small on-resistance. Here, it is generally known that a diode having a small on-resistance has a long reverse recovery time.

Inside the redundant load 60, the first redundant load 61 and the second redundant load 62 are separated. Therefore, the current flowing through the first current path 15 flows only to the first redundant load 61 of the redundant load 60. On the other hand, the current flowing through the second current path 25 flows only to the second redundant load 62 of the redundant load 60. In other words, even when an abnormally large current flows through the first current path 15 due to a ground fault in the first redundant load 61, the second redundant load 62 is capable of functioning properly by causing an appropriate current to flow the second redundant load 62 that does not fail. On the other hand, even when an abnormally large current flows through the second current path 25 due to a ground fault in the second redundant load 62, the first redundant load 61 is capable of functioning properly by causing an appropriate current to flow the first redundant load 61 that is not failed.

The first diode 61d and the second diode 62d do not have to be diode elements. For example, MOSFETs may be arranged on the first connection terminal 15a side and the second connection terminal 25a side inside the redundant load 60, respectively. In this configuration, a parasitic diode of the MOSFET is used to exert the rectifying action of the first diode 61d and the second diode 62d. As the MOSFET, both a p-channel MOSFET and an n-channel MOSFET can be used.

Figure 4:
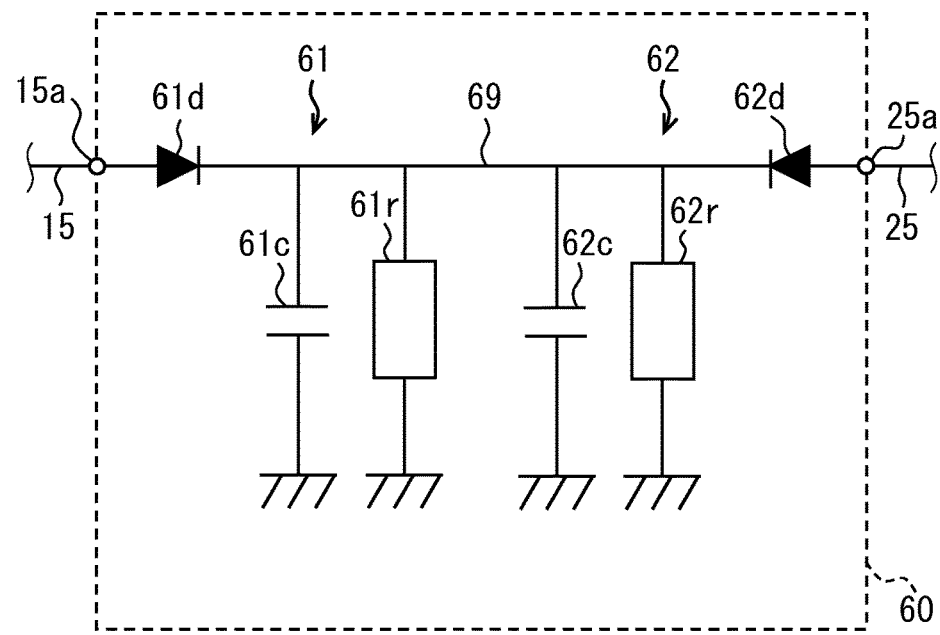
FIG. 4 is a diagram showing an inappropriate redundant load.

FIG. 4 shows an example of a case where the connection of the first current path 15 and the second current path 25 via the redundant load 60 is inappropriate. Inside the redundant load 60, the first redundant load 61 and the second redundant load 62 are connected by a common path 69. Therefore, the current flowing through the first current path 15 flows to both the first redundant load 61 and the second redundant load 62. The current flowing through the second current path 25 also flows through both the first redundant load 61 and the second redundant load 62. In other words, when an abnormally large current flows in the first current path 15 due to a ground fault in the first redundant load 61, an abnormally large current also flows in the second current path 25. In other words, the second redundant load 62 that does not fail is incapable of functioning properly since the voltage of the second current path 25 drops. On the other hand, when an abnormally large current flows in the second current path 25 due to a ground fault in the second redundant load 62 or the like, an abnormally large current also flows in the first current path 15. In other words, the first redundant load 61 that does not fail is incapable of functioning properly since the voltage of the first current path 15 drops.

When the first current path 15 and the second current path 25 are connected via the redundant load 60 and a failure occurs in either the first redundant load 61 or the second redundant load 62, the function of the redundant load 60 cannot be fulfilled as a whole. Therefore, it is important to determine whether the inside of the redundant load 60 is appropriately separable with respect to the redundant load 60 receiving electric power from multiple power systems of the first system 10 and the second system 20 separated from each other. In particular, when the two loads of the first redundant load 61 and the second redundant load 62 are packaged as one redundant load 60, the internal configuration cannot be visually recognized from the outside. Therefore, it is difficult for a user to determine whether the first redundant load 61 and the second redundant load 62 are appropriately separated from each other. Therefore, it is important for the power supply system 1 to determine whether the redundant load 60 connected to the power supply system 1 is an appropriately configured load.

Figure 5:
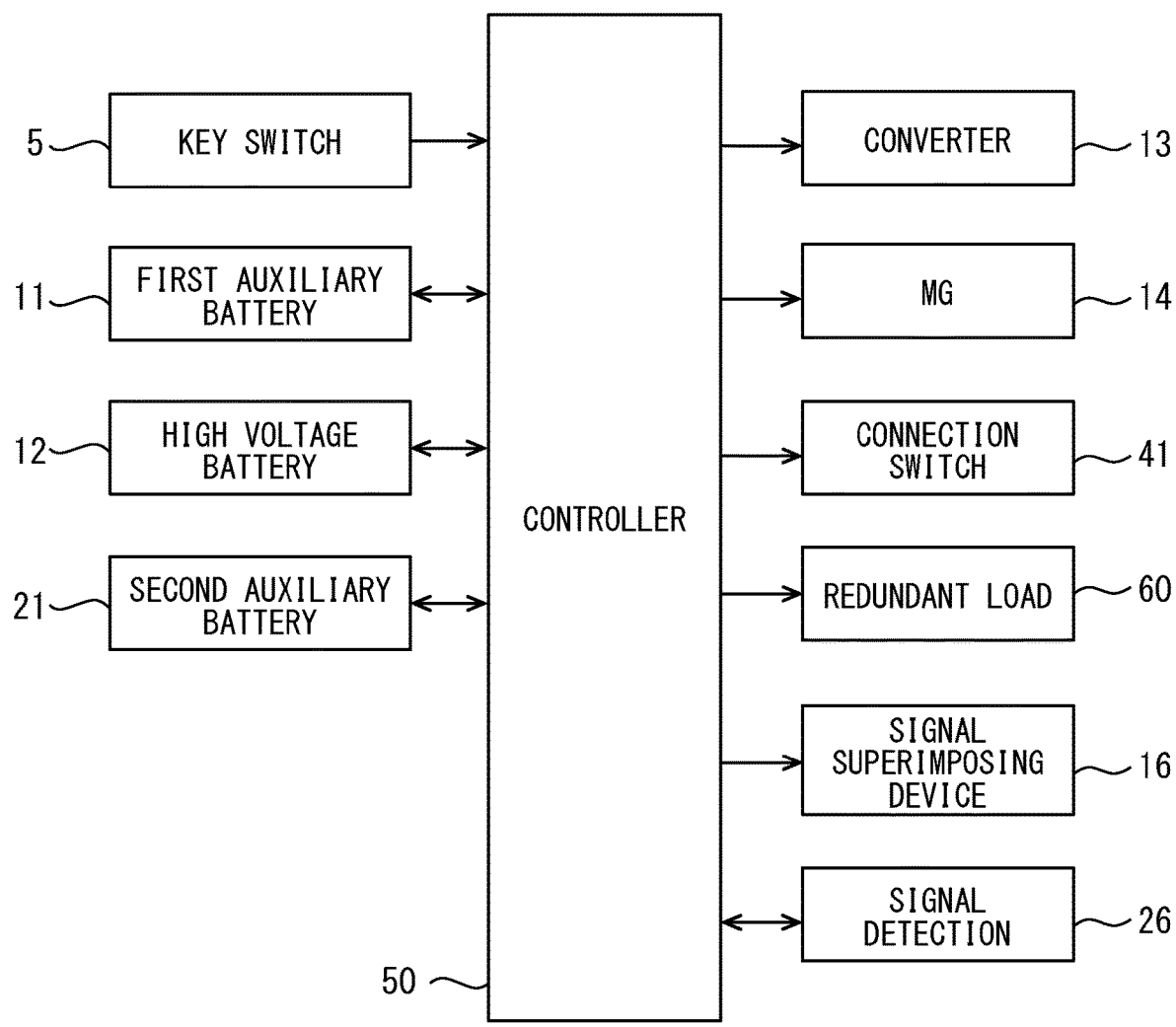
FIG. 5 is a block diagram related to control of the power supply system.

FIG. 5 is a diagram showing a control system. The control device (ECU) in this specification may also be referred to as an electronic control unit. The control device is provided by (a) an algorithm as multiple logic called if-then-else form, or (b) a learned model tuned by machine learning, for example, an algorithm as a neural network.

The control device is provided by a control system including at least one computer. The control system may include multiple computers linked by a data communication device. The computer includes at least one hardware processor that is a processor of hardware. The hardware processor may be provided by (i), (ii), or (iii) below.

(i) The hardware processor may be at least one processor core that executes a program stored in at least one memory. In this case, the computer is provided with at least one memory and at least one processor core. The processor core is called a central processing unit (CPU), a graphics processing unit (GPU), a RISC-CPU, or the like. The memory is also referred to as a storage medium. The memory is a non-transitory and tangible storage medium that non-transitorily stores "program and/or data" readable by the processor. The storage medium may be a semiconductor memory, a magnetic disk, an optical disk, or the like. The program may be distributed as a single unit or as a storage medium in which the program is stored.

(ii) The hardware processor may be a hardware logic circuit. In this case, the computer is provided with a digital circuit including a number of programmed logic units (gate circuits). The digital circuit is also referred to as a logic circuit array, for example, an application-specific integrated circuit (ASIC), a field programmable gate array (FPGA), a programmable gate array (PGA), a complex programmable logic device (CPLD), or the like. The digital circuit may include a memory that stores programs and/or data. The computer may be provided by analog circuit. A computer may be provided by a combination of a digital circuit and an analog circuit.

(iii) The hardware processor may be a combination of the above (i) and the above (ii). (i) and (ii) are disposed on different chips or on a common chip. In these cases, the part (ii) is also called an accelerator.

The control device, the signal source, and the control object provide various elements. At least some of these elements may be referred to as a block, a module, or a section. Furthermore, elements included in the control system are referred to as functional means only when intentional.

A control units and methods described in the present disclosure may be implemented by a special purpose computer which is configured with a memory and a processor programmed to execute one or more particular functions embodied in computer programs of the memory. Alternatively, the control unit and the method described in the present disclosure may be implemented by a dedicated computer configured as a processor with one or more dedicated hardware logic circuits. Alternatively, the control unit and the method thereof described in this disclosure may be realized by one or more dedicated computers configured by a combination of a processor and a memory programmed to execute one or multiple functions, and a processor configured by one or more hardware logic circuits. Further, the computer program may store a computer-readable non-transitional tangible recording medium as an instruction to be performed by the computer.

In FIG. 5, the control unit 50 is connected to a key switch 5. The key switch 5 is a switch for switching a driving state of the vehicle by an operation of an occupant. The key switch 5 is a switch for switching multiple states, for example, an off state, an accessory (ACC) state, and an ignition (IG) state. As the key switch 5, a push button that switches the state when pressed by an occupant may be adopted. The control unit 50 is connected to the key switch 5. The control unit 50 acquires information by operating the key switch 5 by the occupant. More specifically, the control unit 50 acquires information on whether the key switch 5 is in the off state, the accessory state, or the ignition state.

The control unit 50 is connected to the first auxiliary battery 11, the high voltage battery 12, and the second auxiliary battery 21. The control unit 50 acquires information on the current storage amount of each of the first auxiliary battery 11, the high voltage battery 12, and the second auxiliary battery 21. The control unit 50 maintains the current storage amount stored in the first auxiliary battery 11, the high voltage battery 12, and the second auxiliary battery 21 within an appropriate range. That is, for example, when the current storage amount stored in the first auxiliary battery 11 and the second auxiliary battery 21 is small, the MG 14 generates electricity and charges the first auxiliary battery 11 and the second auxiliary battery 21.

The control unit 50 is connected to the converter 13 and the MG 14. The control unit 50 controls the converter 13 to step down the voltage of the high voltage battery 12 as needed. The control unit 50 controls the MG 14 to generate electric power for charging the first auxiliary battery 11, the second auxiliary battery 21, and the like as needed. Further, the control unit 50 controls the MG 14 to acquire a driving force used for driving the vehicle.

The control unit 50 is connected to the connection switch 41 and the redundant load 60. The control unit 50 causes the connection switch 41 switches between the conducted state and the separated state. In the conducted state, the first current path 15 and the second current path 25 are connected via the connection path 45. In the separated state, the first current path 15 and the second current path 25 are separated. The control unit 50 controls the redundant load 60 to exert the function as the redundant load 60. The control unit 50 controls at least an activation timing of the redundant load 60. In other words, the control unit 50 switches between a power-on state in which the redundant load 60 is capable of being driven and a power-off state in which the redundant load 60 is incapable of being driven.

The control unit 50 is connected to the signal superimposition device 16 and the signal detection unit 26. The control unit 50 controls the signal superimposition device 16 to output a test signal. The test signal is output for performing a continuity test for detecting whether the connection between the first current path 15 and the second current path 25 via the redundant load 60 is appropriate. The details of the continuity test will be described in detail later. The control unit 50 controls the signal detection unit 26 to detect the presence or absence of the test signal in the continuity test. The control unit 50 acquires information on the presence or absence of the test signal detected by the signal detection unit 26, and reflects the detection result in the traveling control of the vehicle.

An example of the continuity test by the control unit 50 will be described below with reference to FIGS. 6 and 7. Here, the continuity test is a test for determining whether the first current path 15 and the second current path 25 is conducted via the redundant load 60. In other words, the continuity test is whether the redundant load 60 connected to the power supply system 1 is an inappropriate load that internally conducts the first current path 15 and the second current path 25. In the continuity test, when the first current path 15 and the second current path 25 are conducted, it is determined that the configuration of the redundant load 60 is inappropriate. On the other hand, when the first current path 15 and the second current path 25 are separated, it is determined that the configuration of the redundant load 60 is appropriate.

The continuity test is performed every time the transition from the off state to the ignition state is performed by operating the key switch 5, for example. However, the time point of performing the continuity test is not limited to thereto. For example, the continuity test may be started when the vehicle door is opened from a closed state. Alternatively, the continuity test may be started at the time of the diagnosis check performed by a dealer or the like. Alternatively, the vehicle may be provided with a continuity test start button to start the continuity test, and when the continuity test start button is operated, the continuity test starts. Alternatively, in a vehicle capable of switching between manual driving and automatic driving, the continuity test may be started immediately before switching from manual driving to automatic driving.

Figure 6:
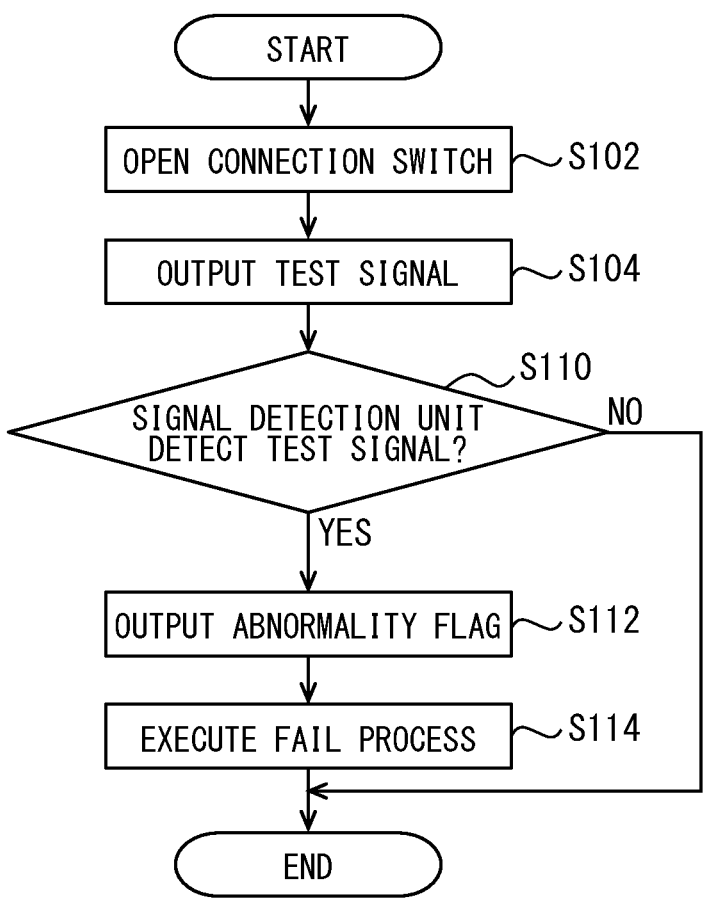
FIG. 6 is a flowchart related to control of the power supply system.
Figure 7:
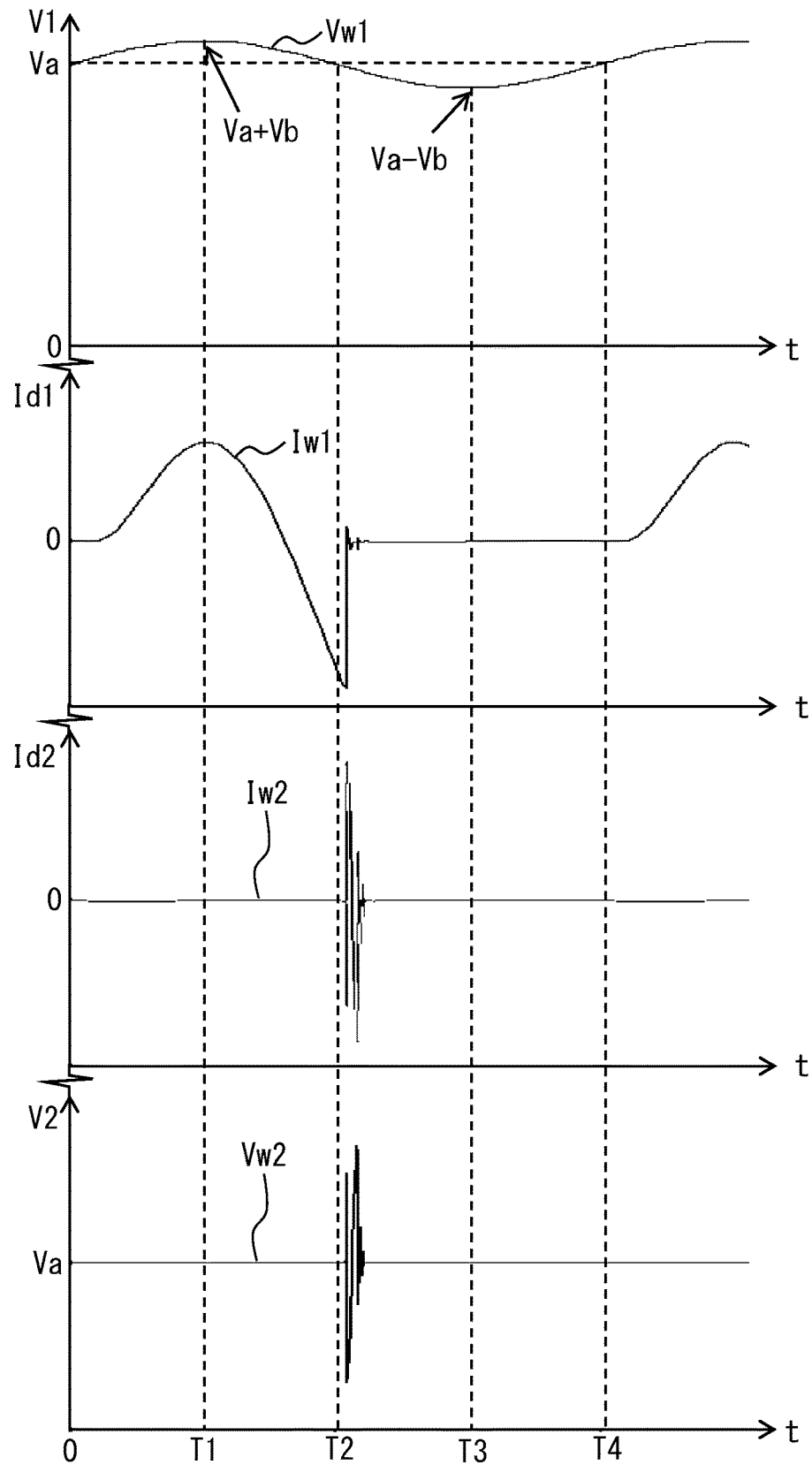
FIG. 7 is a diagram showing change of voltage and current over time in a continuity test of the power supply system to which an inappropriate redundant load is connected.

In FIG. 6, when the continuity test is started, the connection switch 41 is opened in S102. In other words, the first current path 15 and the second current path 25 are in a state not conducted with each other via the connection path 45. As a result, the first current path 15 and the second current path 25 are separated from each other unless the redundant load 60 is an inappropriate load. After opening the connection switch 41, the processing proceeds to S104.

In S104, a test signal is output using the signal superimposition device 16. FIG. 7 shows characteristics when the redundant load 60 is an inappropriate load as shown in FIG. 4. In FIG. 7, the vertical axis represents voltage or current, and the horizontal axis represents time t. As shown in a voltage waveform Vw1, a first voltage V1, which is the voltage at the first connection terminal 15a, is a voltage in which the voltage of the test signal generated by the signal superimposition device 16 is superimposed with respect to the rated voltage Va of the first auxiliary battery 11. The test signal is a sine wave with an amplitude Vb and a period T4. The amplitude Vb is a value smaller than the rated voltage Va of the first auxiliary battery 11. The rated voltage Va is, for example, 12V, and the amplitude Vb is, for example, 1V. The period T4 is, for example, 10 μs. That is, the frequency of the test signal is, for example, 100 kHz. The frequency of the test signal may be high frequency of several MHz.

T1 is a time point at which the magnitude of the first voltage V1 becomes maximum. The magnitude of the first voltage V1 at the time point T1 is the voltage Va+Vb. T3 is a time point at which the magnitude of the first voltage V1 becomes minimum. The magnitude of the first voltage V1 at the time point T3 is the voltage Va−Vb. Each of T2 and T4 is a time point at which the magnitude of the first voltage V1 becomes equal to the magnitude of the rated voltage Va. That is, each of the time points T2 and T4 is a time point when the voltage of the test signal becomes zero.

As shown in a current waveform Iw1, the current Id1 flowing through the first diode 61d changes according to the first voltage V1. During the time from zero to T1, the first voltage V1 is increasing, and a forward current is flowing in the first diode 61d. During the time from T1 to T2, the first voltage V1 is decreasing, and the current flowing through the first diode 61d is reversed from the forward direction to the reverse direction. During the time from T2 to T4, the first voltage V1 is lower than the rated voltage Va of the first auxiliary battery 11. During this period, the recovery current flows instantaneously, but the current does not flow immediately due to the rectifying action of the first diode 61d.

As shown in the current waveform Iw2, the current Id2 flowing through the second diode 62d changes instantaneously under the influence of the recovery current flowing through the first diode 61d. This current is generated by improperly connecting the first redundant load 61 and the second redundant load 62. As shown in FIG. 3, if the first redundant load 61 and the second redundant load 62 are appropriately separated, the current Id2 becomes zero all the time.

As shown in the voltage waveform Vw2, the second voltage V2, which is the voltage at the second connection terminal 25a, increases or decreases by being affected by the current Id2 flowing through the second diode 62d with respect to the rated voltage Va of the second auxiliary battery 21. If the first redundant load 61 and the second redundant load 62 are appropriately separated as shown in FIG. 3, the second voltage V2 does not change from the rated voltage Va of the second auxiliary battery 21.

As described above, by outputting the test signal in S104 of FIG. 6, the recovery current instantaneously flows to the first redundant load 61 due to the recovery characteristics of the first diode 61d. The recovery characteristic is also referred to as the reverse recovery characteristic. When the first redundant load 61 and the second redundant load 62 are improperly connected, this recovery current affects the second redundant load 62, and the magnitude of the second voltage V2 changes. That is, the changed test signal is output as the voltage waveform of the second voltage V2. When the first redundant load 61 and the second redundant load 62 are properly separated, this recovery current does not affect the second redundant load 62, and the magnitude of the second voltage V2 does not change. That is, the test signal is not output to the voltage waveform of the second voltage V2. After outputting the test signal, the processing proceeds to S110.

In S110, the signal detection unit 26 detects the test signal. Since the signal detection unit 26 is connected to the second current path 25, the signal detection unit 26 measures the magnitude of the second voltage V2 in the second current path 25. When the signal detection unit 26 detects a voltage waveform different from the voltage output by the second auxiliary battery 21, it is determined that the test signal output from the signal superimposition device 16 is detected via the redundant load 60, and the processing proceeds to S112. On the other hand, when the signal detection unit 26 detects a voltage waveform equal to the voltage output by the second auxiliary battery 21, it is determined that the test signal has not been detected and the continuity test is terminated.

In S112, the control unit 50 outputs an abnormality flag to the travel control unit, the display control unit, and the like. This abnormality flag is a signal indicating that there is a high possibility that the vehicle cannot run normally. After outputting the abnormality flag, the processing proceeds to S114.

In S114, the control unit 50 executes the fail process. In the fail process, the function that requires the operation of the redundant load 60 is stopped. An example of the fail process will be described below. When the redundant load 60 has a peripheral monitoring function used for automatic driving and it is in a state before traveling, the automatic driving function is stopped and only manual driving is permitted. When the vehicle is traveling in automatic driving, Take Over Request (TOR) is started. TOR is to issue a request to give the driving responsibility to the driver for the purpose of stopping the automatic driving in the event of an abnormality. When the driver responds to the TOR request, the automatic driving is switched to the manual driving. When the driver does not respond to the TOR request, Minimum Risk Machine (MRM) is started while maintaining the automatic driving. MRM is a driving control that stops in a traveling lane or near a road shoulder by automatic driving.

Another example of the fail process will be described below. When the redundant load 60 is an electric power steering device and it is in a state before traveling, the traveling cannot be started. When the vehicle is in the traveling state, the occupant is notified to stop the driving. In addition, the occupant is also notified that there is a high possibility that the redundant load 60 may not function and that repair is required. After executing the fail process, the continuity test is completed.

According to the above described embodiment, the control unit 50 executes a continuity test in a state where the redundant load 60 is connected to the first current path 15 and the second current path 25, and determines whether the first current path 15 and the second current path 25 are conducted. Therefore, in the redundant load 60 that receives electric power from different current paths of the first current path 15 and the second current path 25, the configuration can determines whether the internal configuration of the redundant load 60 and the connection method to the power supply system 1 are appropriate. In other words, it is possible to provide a power supply system 1 capable of determining whether the connection of the redundant load 60 is appropriate. In particular, in a vehicle capable of performing automatic driving, it is very important to determine whether the load for automatic driving is an appropriate load for safe and comfortable driving control in automatic driving.

The control unit 50 executes the continuity test after switching the connection switch 41 so that the first current path 15 and the second current path 25 are separated in the connection path 45. Therefore, it is possible to inhibit the test signal output by the signal superimposition device 16 from being detected by the signal detection unit 26 via the connection path 45. Therefore, it is possible to determine whether the redundant load 60 is an appropriate load. Even when the connection switch 41 is in an inseparable state due to a failure such as welding or a short circuit, this failure can be detected by the above detection method. Further, when it is not necessary to separate the first current path 15 and the second current path 25, the connection switch 41 can be closed in order to conduct the first current path 15 and the second current path 25. Therefore, the second auxiliary battery 21 can be charged by using the electric power generated by the MG 14. Further, electric power can be supplied from both the batteries of the first auxiliary battery 11 and the second auxiliary battery 21 to the respective loads of the first redundant load 61 and the second redundant load 62. Therefore, it is easy to stably supply electric power to the redundant load 60.

The magnitude of the amplitude Vb of the test signal is not limited to 1V, and may be about 0.1V as long as the presence or absence of the test signal can be correctly detected by the signal detection unit 26. The magnitude of the period T4 of the test signal is not limited to 10 μs, and may be about 10 ms as long as the presence or absence of the test signal can be correctly detected by the signal detection unit 26. That is, the time T1 which is the time from the output of the sine wave test signal to the maximum amplitude Vb may be about 2.5 ms. In this case, the frequency of the test signal is 100 Hz. The test signal can be used from a low frequency of about 100 Hz to a high frequency of about several MHz when the signal detection unit 26 can correctly detect the presence or absence of the test signal. In the test signal, the time from when the test signal is output until the amplitude Vb reaches the maximum is the rise time.

The waveform of the test signal is not limited to a sine wave. For example, a rectangular wave may be output as a test signal. When a rectangular wave is used, the rise time is preferably 2.5 ms or less. Further, in the case of a rectangular wave, it is easy to shorten the rise time as compared with a sine wave. Therefore, it is easy to output a pulse signal having a steep rise.

The rise time of the test signal is 2.5 ms or less. Therefore, the test signal easily passes through the first diode 61d by utilizing the recovery characteristic of the first diode 61d. In other words, when the rise time is longer than the recovery time, which is the time during which the recovery current flows, it is difficult for the recovery current to flow. That is, it becomes difficult to detect the test signal using the recovery characteristic of the first diode 61d. Therefore, by using the test signal having a short rise time, the recovery characteristic can be used without any problem, and the presence or absence of the test signal can be accurately detected.

Instead of using the signal superimposition device 16 to output the test signal, the converter 13 may generate the test signal. According to this configuration, it is not necessary to provide the signal superimposition device 16 as a dedicated component for the continuity test. Therefore, it is easy to reduce the number of parts of the power supply system 1 and design the power supply system 1 to be compact and lightweight. In a moving body, the heavier the weight, the more energy required for movement. Therefore, it is very important to reduce the weight of the entire moving body.

Second Embodiment

This embodiment is a modification example which is based on the preceding embodiment. In this embodiment, an integrated starter generator 214 that functions as a signal generation unit is connected to the first current path 15. Further, the redundant load 60 is activated before the test signal is output.

Figure 8:
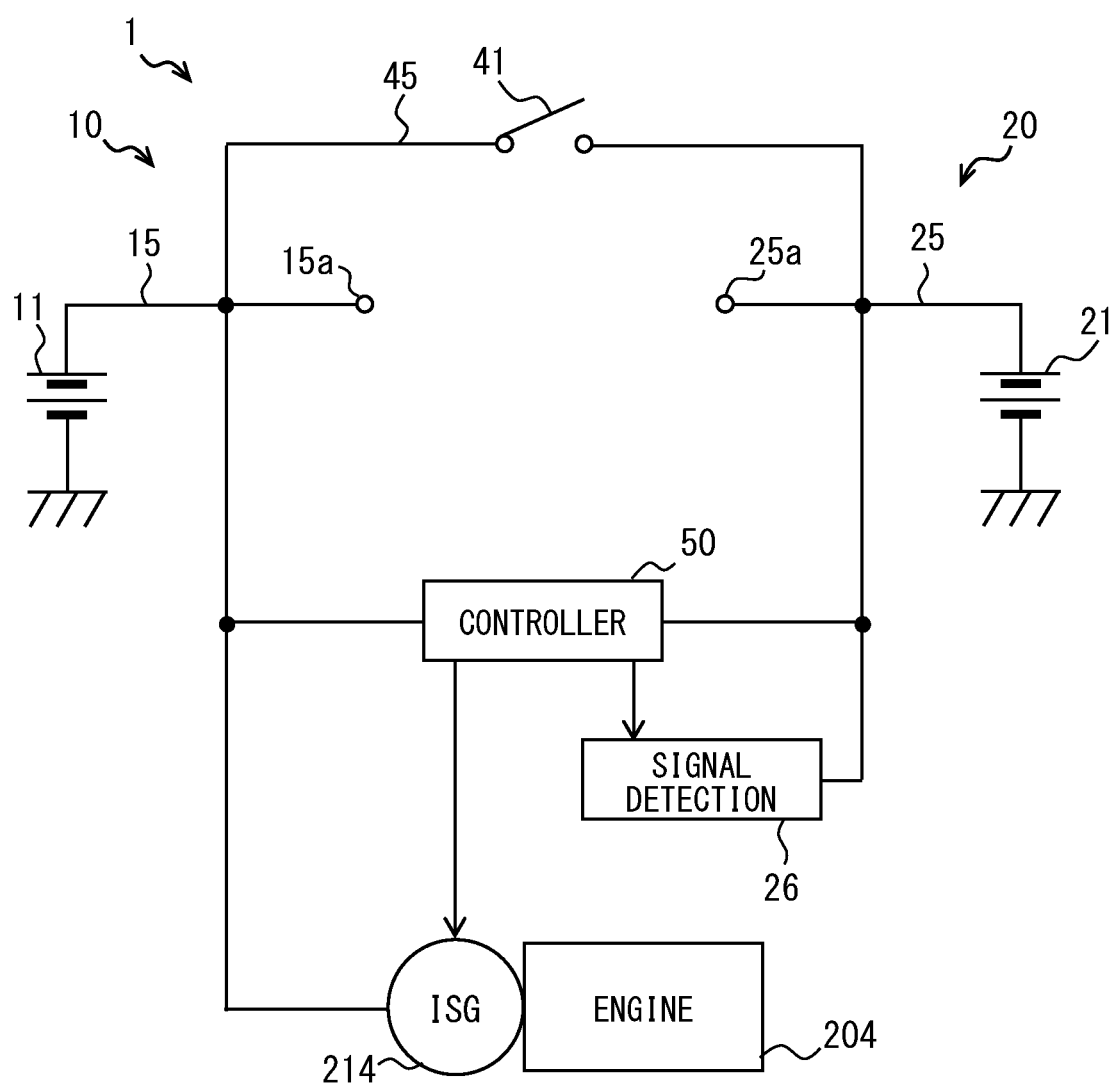
FIG. 8 is a diagram showing a schematic configuration of a power supply system for a moving body according to a second embodiment.

In FIG. 8, the power supply system 1 includes an engine 204 and the integrated starter generator 214. Hereinafter, the integrated starter generator 214 may be referred to as an ISG 214. The engine 204 is a prime mover that provides driving force in vehicle traveling. The ISG 214 functions as a starter for starting the engine 204 and a generator for generating electric power by the engine 204 of the vehicle driving.

The ISG 214 is connected to the first current path 15. The control unit 50 controls the function as a starter and the function as a generator of the ISG 214. By controlling the function of the ISG 214 as a generator, the voltage of the first current path 15 can be increased or decreased. That is, a test signal can be generated by controlling the function of the ISG 214 as a generator. Further, by controlling the function of the ISG 214 as a generator, the first auxiliary battery 11 can be charged. The ISG 214 provides an example of a signal generation unit. The ISG 214 provides an example of a generator.

Figure 9:
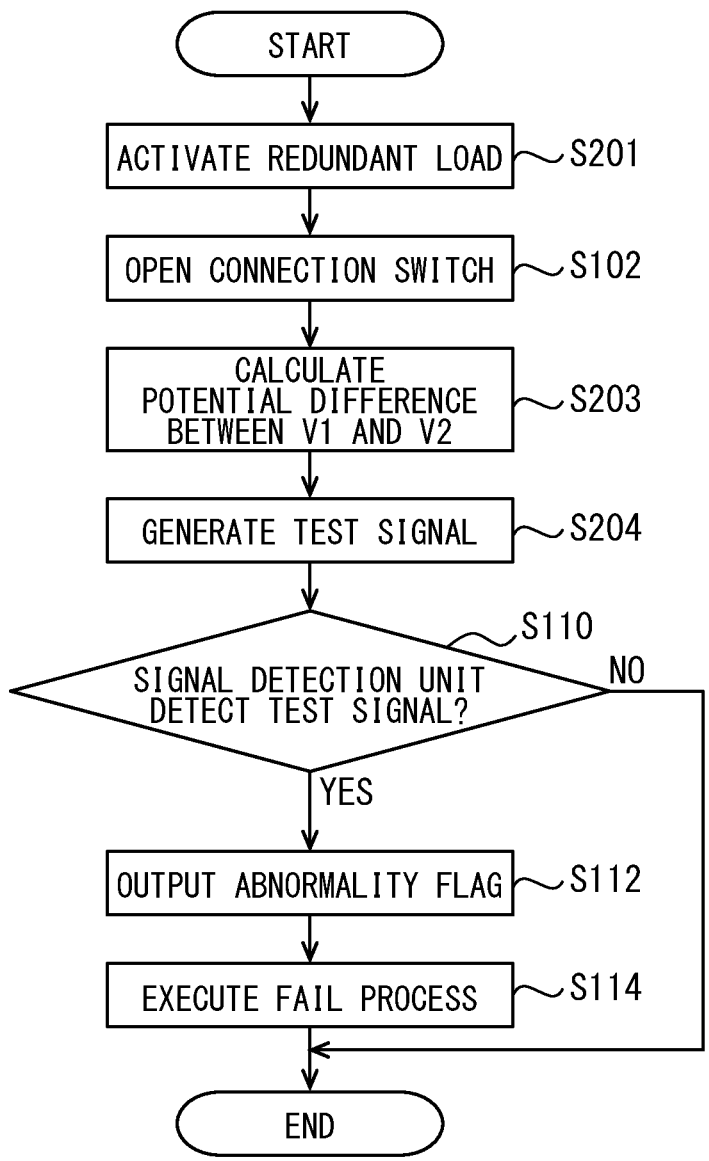
FIG. 9 is a flowchart related to control of the power supply system according to the second embodiment.

In FIG. 9, when the continuity test is started, the redundant load 60 is activated in S201. That is, the redundant load 60 is changed from the power-off state to the power-on state. As a result, the state of power supply to the redundant load 60 can be made the same as the state in which the vehicle actually travels. When the first diode 61d and the second diode 62d of the redundant load 60 are composed of switches such as MOSFETs having parasitic diodes, these switches are turned on. After the redundant load 60 is activated, the processing proceeds to S102. In S102, the connection switch 41 is opened. Thereafter, the processing proceeds to S203.

In S203, the potential difference between the first voltage V1 which is the voltage applied to the first redundant load 61 and the second voltage V2 which is the voltage applied to the second redundant load 62 is calculated. While the connection switch 41 is closed, the potentials of the first current path 15 and the second current path 25 are equal. Therefore, the potential difference between the first voltage V1 and the second voltage V2 becomes zero. However, when the connection switch 41 is open, the potentials of the first current path 15 and the second current path 25 are not always equal. In particular, when electric power consumed by the load connected to the first current path 15 and electric power consumed by the load connected to the second current path 25 are significantly different, the potential difference between the first current path 15 and the second current path 25 tends to be large. Therefore, the first voltage V1 and the second voltage V2 are measured, and the potential difference between the first voltage V1 and the second voltage V2 is calculated. After the potential difference between the first voltage V1 and the second voltage V2 is calculated, the processing proceeds to S204.

In S204, a test signal is generated. That is, the output voltage of the ISG 214 is changed to change the magnitude of the first voltage V1. The amount of change in voltage from the rated voltage of the first auxiliary battery 11 corresponds to the test signal generated by the ISG 214. By changing the magnitude of the first voltage V1, a recovery current, which is a current flowing in the direction opposite to the rectifying direction, flows through the first diode 61*d*. When the redundant load 60 is properly separated, the second voltage V2 is unaffected by the recovery current. When the redundant load 60 is not properly separated, the second voltage V2 is affected by the recovery current.

The amplitude Vb of the test signal generated by controlling the ISG 214 is set to a value larger than the potential difference between the first voltage V1 and the second voltage V2. That is, while the test signal is being generated, both a state in which the first voltage V1 is higher than the second voltage V2 and a state in which the first voltage V1 is lower than the second voltage V2 are generated. When the first voltage V1 and the second voltage V2 before generating the test signal is respectively 12.0V and 12.5V, a test signal having an amplitude Vb greater than at least 0.5V is output. After the test signal using the ISG 214 is generated, the processing proceeds to S110.

According to the above described embodiment, the signal generation unit is provided by an ISG 214 capable of charging the first auxiliary battery 11. Therefore, a test signal can be generated without providing a dedicated component that functions as a signal generation unit. Therefore, the number of parts of the power supply system 1 can be reduced as compared with the case where the signal generation unit is provided separately from the ISG 214. Therefore, it is easy to design the power supply system 1 for a mobile body in a small size and light weight.

The control unit 50 executes the continuity test with the redundant load 60 activated. Therefore, even when the redundant load 60 is an appropriate load in a case where it is not activated and is an inappropriate load in a case where it is activated, the configuration can accurately detect whether the internal configuration of the redundant load 60 and the connection method to the power supply system 1 for a mobile body are appropriate.

The ISG 214 generates a test signal having a voltage greater than the potential difference between the potential of the first current path 15 and the potential of the second current path 25. Therefore, the configuration can reliably detect the presence or absence of the test signal using the recovery characteristic of the first diode 61*d*.

Third Embodiment

This embodiment is a modification example which is based on the preceding embodiment. In the third embodiment, a generator 314 is connected to the first current path 15.

Figure 10:
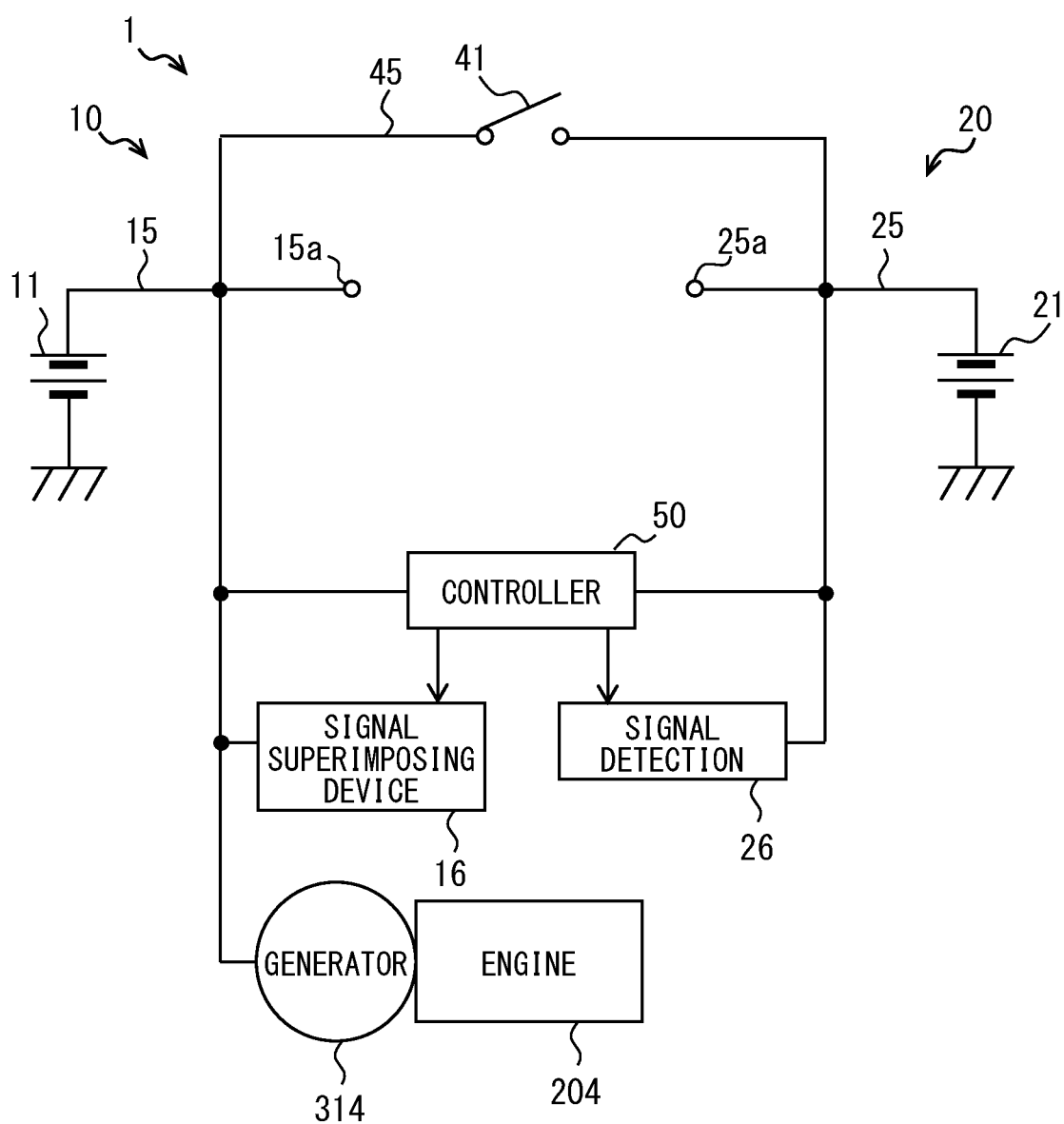
FIG. 10 is a diagram showing a schematic configuration of a power supply system for a moving body according to a third embodiment.

In FIG. 10, the generator 314 is a device that generates electric power for supplying various electric devices, and generates electric power by using a part of the power of the engine 204 or the like. The generator 314 is connected to the first current path 15 together with the first auxiliary battery 11 and the signal superimposition device 16. The generator 314 charges the first auxiliary battery 11, the second auxiliary battery 21, and the like as needed.

In the continuity test, when the signal superimposition device 16 outputs a test signal, the power generation of the generator 314 is stopped. As a result, the configuration can inhibit the potential difference between the first current path 15 and the second current path 25 from becoming too great. Therefore, even when the voltage of the test signal of the signal superimposition device 16 is small, it is easy to detect the presence or absence of the test signal by using the recovery characteristic of the first diode 61*d*.

Instead of using the signal superimposition device 16 to output the test signal, the generator 314 may generate the test signal. With this configuration, the generator 314 mounted for charging the first auxiliary battery 11 and the second auxiliary battery 21 can be used for the continuity test. Therefore, the signal superimposition device 16 which is a dedicated component mounted on the power supply system 1 for the purpose of continuity test can be reduced. In this case, the generator 314 provides an example of a signal generation unit.

Other Embodiments

Both the signal superimposition device 16 and the signal detection unit 26 may be provided in each of the first current path 15 and the second current path 25. In this configuration, a test signal is output to the first current path 15, and then presence or absence of the test signal in the second current path 25 is detected. Thereafter, a test signal is output to the second current path 25, and then presence or absence of the test signal in the first current path 15 is detected. In other words, in the two paths of the first current path 15 and the second current path 25, the side that outputs the test signal and the side that detects the test signal can be exchanged to execute the continuity test. Therefore, in one continuity test, the test signal is exchanged for multiple times to determine the detection result. Therefore, it is possible to more accurately determine whether the redundant load 60 is an appropriate load. Further, multiple signal superimposition devices 16 and multiple signal detection units 26 are provided. Therefore, even if any one of the devices fails, the continuity test can be executed using the remaining normal devices.

The first system 10 may be provided with a variable resistor for the purpose of lowering the voltage applied to the first redundant load 61. In this configuration, by controlling the magnitude of the resistance value of the variable resistor by the control unit 50, the first voltage V1 can be lowered and a test signal can be generated. That is, the variable resistor functions as a signal generation unit. In this case, the first voltage V1 is set to a voltage higher than the second voltage V2 before the test signal is generated. In addition, the variable resistor controls the amount of voltage drop of the first voltage V1 so that the value of the first voltage V1 is both higher and lower than the second voltage V2.

The continuity test may be executed in both the state where the redundant load 60 is not connected and the state where the redundant load 60 is connected. In this configuration, it is possible to determine whether the redundant load 60 is the cause of the inability to properly separate the first current path 15 and the second current path 25. In other words, when it is determined that the first current path 15 and the second current path 25 are not separated as a result of the continuity test in the state where the redundant load 60 is not connected, it is determined that the mobile power supply system 1 has failure. Therefore, a continuity test is executed when the redundant load 60 is not connected to determine that there is no defect on the mobile power supply system 1 side. Thereafter, a continuity test is executed when the redundant load 60 is connected to determine whether there is defect on the redundant load 60 side.

The disclosure in this specification and drawings is not limited to the exemplified embodiments. The disclosure encompasses the illustrated embodiments and modifications by those skilled in the art based thereon. For example, the disclosure is not limited to the parts and/or combinations of elements shown in the embodiments. Disclosure can be implemented in various combinations. The disclosure may have additional parts that may be added to the embodiment. The disclosure encompasses omission of the components and/or the elements of the embodiments. The disclosure encompasses a replacement or a combination of the components and/or the elements between one embodiment and another. The disclosed technical scope is not limited to the description of the embodiments. The several technical ranges disclosed are indicated by the description of the claims, and should be construed to include all modifications within the meaning and range equivalent to the description of the claims.

What is claimed is:

1. A power supply system for moving body comprising:
   a first power source configured to supply electric power to a redundant load;
   a first current path configured to connect the first power source and the redundant load;
   a signal generation unit connected to the first current path and configured to generate a test signal;
   a second power source configured to supply electric power to the redundant load;
   a second current path configured to connect the second power source and the redundant load;
   a signal detection unit connected to the second current path and configured to detect presence or absence of the test signal; and
   a control unit configured to execute a continuity test in a state where the redundant load is connected to the first current path and the second current path, wherein,
   in the continuity test, the control unit determines whether the first current path and the second current path are conducted with each other based on a detection result of the test signal in the signal detection unit.

2. The power supply system according to claim 1, further comprising:
   a connection path configured to connect the first current path and the second current path; and
   a connection switch configured to switch between a conducted state in which the first current path and the second current path are electrically connected via the connection path and a separated state in which the first current path and the second current path are separated in the connection path, wherein
   the control unit executes the continuity test after causing the connection switch to switch to the separated state.

3. The power supply system according to claim 1, further comprising:
   a high voltage power source that is a power source different from the first power source and the second power source; and
   a converter configured to step down an output voltage of the high voltage power source, wherein
   the signal generation unit is provided by a converter.

4. The power supply system according to claim 1, wherein
   the first power source is provided by a first auxiliary battery configured to store electric power supplied to the redundant load, and
   the signal generation unit is provided by a generator configured to charge the first auxiliary battery.

5. The power supply system according to claim 1, wherein
   the control unit executes the continuity test with the redundant load activated.

6. The power supply system according to claim 1, wherein a rise time of the test signal is equal to or less than 2.5 ms.

7. The power supply system according to claim 1, wherein the signal generation unit generates the test signal having a voltage greater than a potential difference between a potential of the first current path and a potential of the second current path.

8. A power supply system for moving body comprising:
   a first power source configured to supply electric power to a redundant load;
   a first current path configured to connect the first power source and the redundant load;
   a signal generation circuit connected to the first current path and configured to generate a test signal;
   a second power source configured to supply electric power to the redundant load;
   a second current path configured to connect the second power source and the redundant load;
   a signal detection circuit connected to the second current path and configured to detect presence or absence of the test signal; and
   a processor configured to execute a continuity test in a state where the redundant load is connected to the first current path and the second current path, wherein,
   in the continuity test, (i) the processor causes the signal generation circuit to transmit the test signal to the redundant load, and (ii) the processor determines that the first current path and the second current path are electrically connected with each other in response to the signal detection circuit detecting the test signal.

* * * * *